(12) United States Patent
Pugh

(10) Patent No.: US 6,904,105 B1
(45) Date of Patent: Jun. 7, 2005

(54) METHOD AND IMPLEMENTION OF A TRACEBACK-FREE PARALLEL VITERBI DECODER

(75) Inventor: Daniel J. Pugh, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 637 days.

(21) Appl. No.: 09/698,698

(22) Filed: Oct. 27, 2000

(51) Int. Cl.[7] .......................... H04L 27/06; G06F 11/10
(52) U.S. Cl. ...................... 375/341; 375/262; 375/265; 714/795; 714/796
(58) Field of Search .............................. 375/262, 265, 375/340, 341; 714/794, 795, 796

(56) References Cited

U.S. PATENT DOCUMENTS

| | | | | |
|---|---|---|---|---|
| 5,878,098 A | * | 3/1999 | Wang et al. ................ | 375/377 |
| 5,923,713 A | * | 7/1999 | Hatakeyama ................ | 375/341 |
| 5,966,534 A | * | 10/1999 | Cooke et al. ................ | 717/155 |
| 5,970,254 A | * | 10/1999 | Cooke et al. ................ | 712/37 |
| 6,330,684 B1 | * | 12/2001 | Yamanaka et al. ............. | 714/1 |
| 6,438,181 B1 | * | 8/2002 | Setlur et al. ................ | 375/341 |
| 6,637,004 B1 | * | 10/2003 | Mizuno et al. ............. | 714/796 |
| 6,680,986 B1 | * | 1/2004 | Hemmati ..................... | 375/341 |

OTHER PUBLICATIONS

Andrew J. Viterbi, "Error Bounds for Convolutional Codes and an Asymptotically Optimum Decoding Algorithm", Published in IEEE Transactions on Information Theory, vol. IT–13, pp. 260–269, in Apr. 1967.*

* cited by examiner

Primary Examiner—Young T. Tse
(74) Attorney, Agent, or Firm—Lanny P. Parker

(57) ABSTRACT

The traceback operation for a Viterbi algorithm can be minimized by producing optimal path values for each state in the trellis, and updating the optimal path values at each state for each symbol. The optimal path value can be used to quickly determine the output values for the system without requiring a traceback which would typically require a memory read for each transmitted symbol.

19 Claims, 15 Drawing Sheets

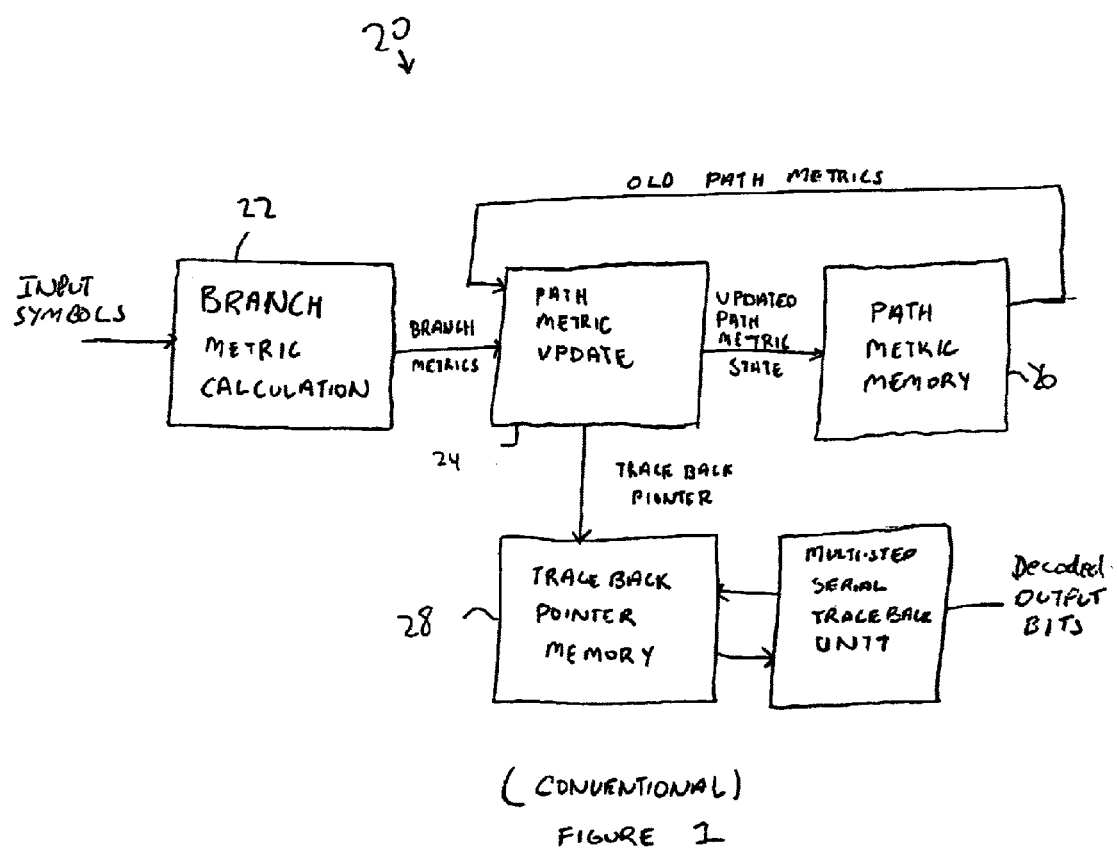
(CONVENTIONAL)
FIGURE 1

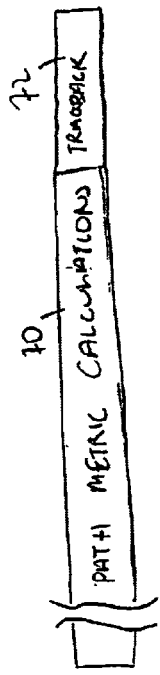
FIGURE 6A (CONVENTIONAL)

METHOD AND IMPLEMENTION OF A TRACEBACK-FREE PARALLEL VITERBI DECODER

BACKGROUND OF THE PRESENT INVENTION

The present invention relates to implementations of the Viterbi algorithm, especially implementations that parallelize some of the steps of the Viterbi algorithm.

Viterbi decoding was developed by Andrew J. Viterbi. The seminal paper on the technique is "Error Bounds for Convolutional Codes and an Asymptotically Optimum Decoding Algorithm" published in *IEEE Transactions on Information Theory*, Vol. IT-13, pages 260–269, in April 1967. Viterbi decoding has been found to be optimal when the channel of the transmitted signal is corrupted by additive white Gaussian noise (AWGN). AWGN is noise whose voltage distribution over time has a characteristic that can be described using a Gaussian distribution (normal statistical distribution or bell curve distribution).

The Viterbi algorithm uses a trellis which restricts the number of state transitions. In the Viterbi algorithm, each new state has a specified number of possible state transitions from previous states. A branch metric comparing a selected value to an ideal value for a transition is calculated for each transition. The branch metric value is combined with a prior state path metric value, in order to produce updated candidate path metrics. For each new state, the candidate path metric with the lowest value is selected. An indication of the selected transition into the new state for that symbol is also stored.

FIG. 1 shows a conventional block diagram of a conventional Viterbi algorithm. In block 22, a branch metric calculation is done. The branch metric calculation compares the actual received value with the ideal received value for different symbol transmissions. In a binary symbol encoding system, for example, one of the transitions going into a state corresponds to the transmitted symbol "0", and one of the transitions corresponds to the transmitted symbol "1." The difference between the input symbol value and the value that would be received in the ideal case if a "1" is transmitted is the branch metric for the "1" transition and the difference between the received sample value and the ideal value if a "0" is transmitted would be the branch metric for the other branch. The branch metrics are added to the old value of the path metric for the source states. The two new candidate path metrics are compared to select the smallest (lower-energy) path metric. Unit 24 is typically called an add-compare-select (ACS) unit. The updated path metrics are stored in a path metric memory 26. In the system of FIG. 1, when the new path metric is produced, a traceback pointer is stored in the traceback pointer memory 28. The traceback pointer indicates the transition into the new state for one symbol. Trackback pointers are stored for every state of every symbol.

In the simplest state, the convolution encoder is reinitialized to an all-zero state at the end of a transmitted block of data. This typically means that at the receiver, state "0" is assumed to be the correct state after the transmission of the block. In the traceback algorithm, the data for each symbol transmitted needs to be examined to determine the transition of the decided path. This typically is a serial operation which takes at least as many steps as symbols within the transmitted block.

It is desired to have an improved method which speeds up the operation of the Viterbi algorithm.

SUMMARY OF THE INVENTION

One embodiment of the present invention comprises a Viterbi algorithm using an optimal path value generator for each state in the trellis, the optimal path value indicating more than one transition of the selected trellis path. This optimal path value can then be used to determine the output in fewer steps than the conventional traceback. In a preferred embodiment, the old optimal path for the source state transitioning into the new state is appended with new data indicating the selected state to produce the new optimal path value. The first selected optimal path value will indicate the best estimate of the transmitted symbols.

One embodiment of the present invention comprises a method of implementing the Viterbi algorithm comprising calculating branch metrics for branches of the Viterbi trellis, combining branch metrics with old path metrics to produce candidate path metrics, selecting a new path metric associated with a selected trellis path for each state in the trellis from the candidate path metrics, and composing an optimal path value for each state in trellis, the optimal path value indicating multiple transitions of the selected trellis path.

Another embodiment of the present invention is an apparatus to implement the Viterbi algorithm comprising a path metric storage adapted to store a path metric associated with a selected trellis path for each state in the Viterbi trellis, a path update unit adapted to update each path metric, an optimal path value storage adapted to store an optimal path value for each state in the trellis, the optimal path value indicating multiple transitions of the selected trellis path, and an optimal path value update unit adapted to update each optimal path value.

BRIEF DESCRIPTION OF THE DRAWINGS

FIG. 1 is a diagram of a conventional Viterbi algorithm system.

FIGS. 6A–6C are diagrams that illustrate the time improvement which can be obtained with the system of the present invention.

DETAILED DESCRIPTION OF THE PREFERRED EMBODIMENT

Figure 2:
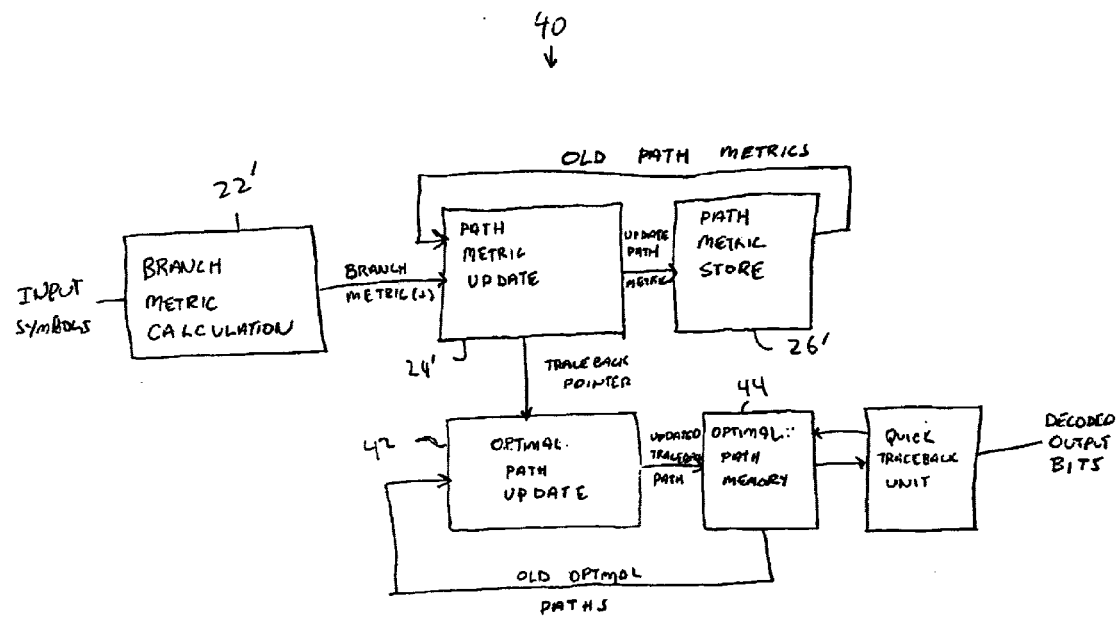
FIG. 2 is a diagram illustrating a system which constructs optimal path values for each state in the Viterbi trellis.

FIG. 2 is an example of a block diagram of the parallel Viterbi algorithm 40 used in the present invention. The branch metric calculation block 22', path metric update 24' and path metrical store 26' operates as in the conventional Viterbi unit.

The optimal path update block 42 produces optimal path data for each state in the trellis. The optimal path value indicates transitions in the minimum-energy path from the beginning of the block to that trellis state. To update the optimal path, optimal paths for the source states transitioning into the current trellis state are loaded into the optimal path update 42 from the optimal path memory 44. New data indicating the selected transition into the trellis state is appended to the end of the optimal path value of the selected prior state. Eventually, after all the blocks of the symbols are transmitted, the optimal path memory 44 for the lowest energy state will indicate the optimal path through the trellis for all the symbols and thus be able to be used to determine the output symbols. In a preferred embodiment, the "new data" appended for the optimal path value indicates the transmitted symbol. Note that the traceback operation is significantly sped up. In one embodiment, if the optimal path value is stored in the memory without being fragmented, the read-back could take a single step. As will be described below with respect to FIG. 7, in a preferred embodiment, the optimal path value will be fragmented and placed into multiple memory blocks to simplify processing; however, the operation of the traceback is still significantly sped up.

Figure 3:
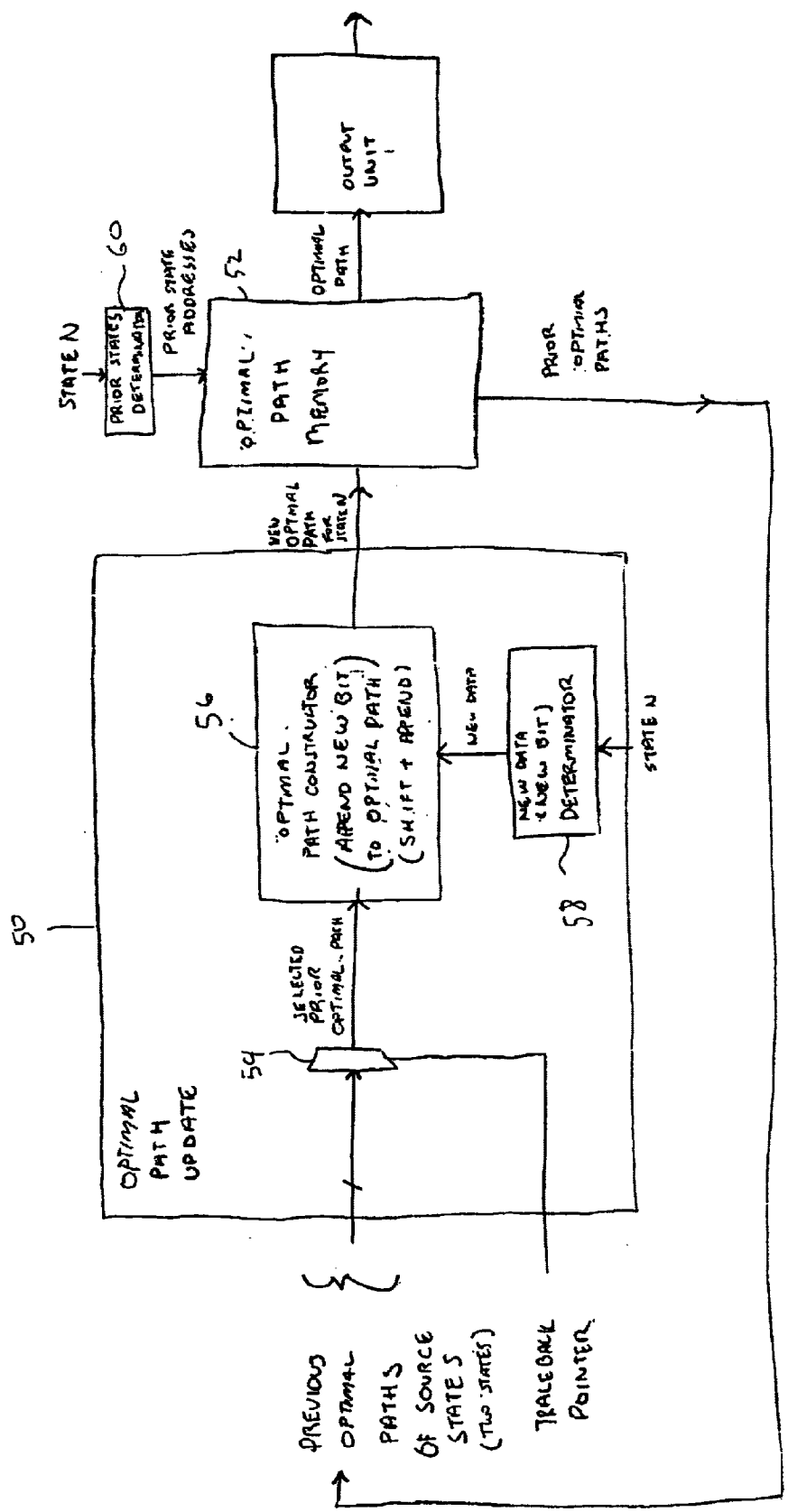
FIG. 3 is a diagram of one example of an optimal path update of one embodiment of the present invention.

FIG. 3 illustrates the operation of an optimal path update unit 50 of one embodiment of the present invention. Previous optimal path values of the source states into the current trellis state are loaded from the optimal path memory 52. As will be described below, this loading of the previous optimal paths can be done in a preloading step. Multiplexer 54 is used to select the desired previous optimal path using the traceback pointer value produced by the path metric update unit. The traceback pointer is an indication of which of the transitions into a state is selected in the ACS operations of the path metric update unit. The optimal path constructor unit 56 appends "new data" to the old optimal path. In a preferred embodiment the new data is shifted into the least significant bits. The new data determinator 58 determines the "new data." In one embodiment the new data is data indicative of the estimated value of the transmitted symbol. This also gives an indication of the preferred transitions in the selected trellis path. The number of previous optimal paths selected from is determined by the number of transition paths going into a single state in the trellis. For binary transmission systems, two transitions are used, and a single bit of new data is added to the optimal path value. For quatranary transmission systems, four previous optimal paths (prior states) are selected from, and two bits of new data appended to the optimal path value.

Block 60 indicates a prior state determination used to produce the prior state addresses into the optimal path memory. Note that the prior states for the optimal path update are the prior states which are needed for the path metric update in the path metric update portion of the Viterbi algorithm. Thus, the addressing systems of the two portions can be shared.

Figure 4:
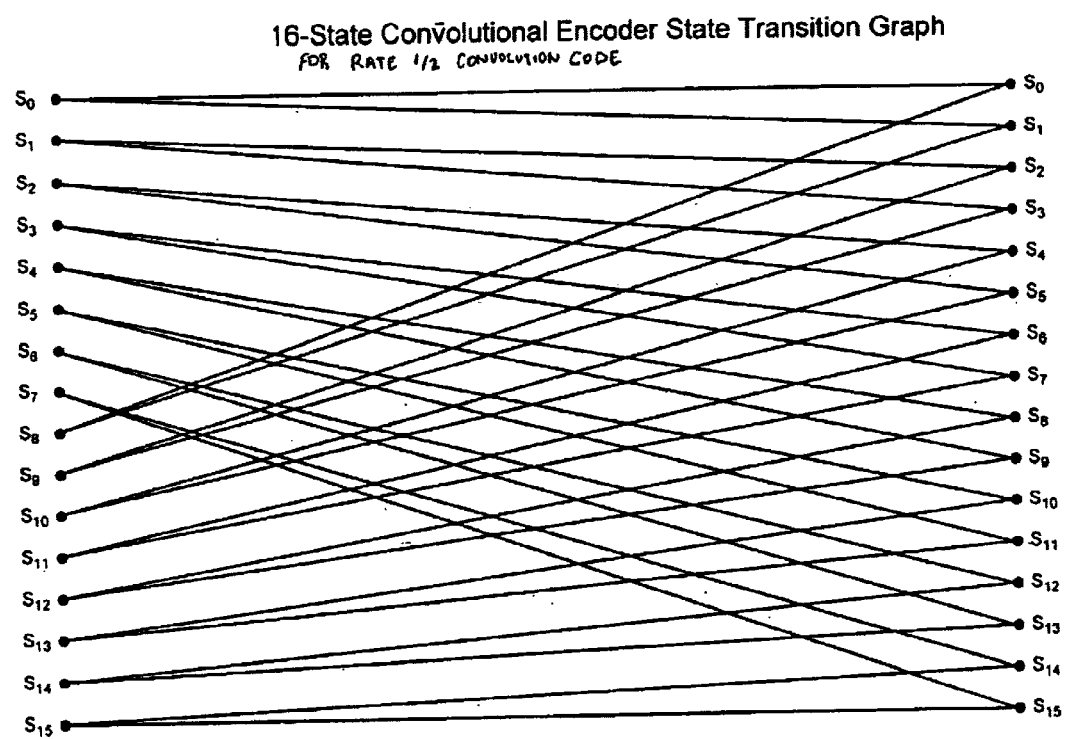
FIG. 4 is a diagram of an example of a 16-state Viterbi trellis.
Figure 5:
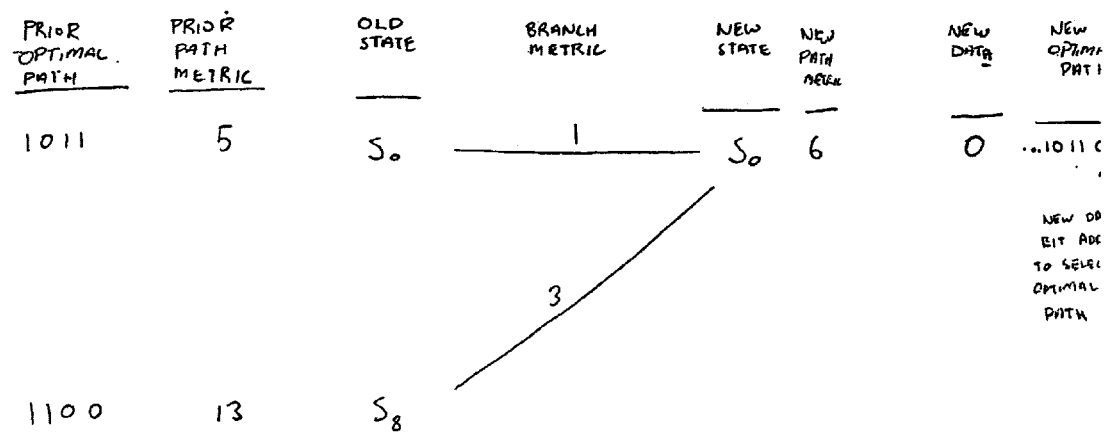
FIG. 5 is a diagram of the calculations which are done for each state and each symbol in the system of one embodiment of the present invention.

FIG. 4 illustrates a 16-state convolution encoder state transition graph for a rate one-half convolution code. FIG. 5 illustrates an example of a transition calculation for one embodiment of the present invention. Note that the new state $S_0$ may have a previous state, being either $S_0$ or $S_8$. In the Viterbi algorithm of the present invention, a branch metric is calculated for each transition between the states. The branch metric is calculated for each of the possible transitions between states in the trellis. In this example, the branch metric between the old state $S_0$ and the new state $S_0$ has a branch metric of 1. The branch between the old state $S_8$ and the new state $S_0$ has a branch metric of 3. After the calculation of the branch metric, the branch metric is added to the prior path metric of the old state to produce two candidate path metrics. One of the candidate path metrics corresponds to the transition between the old state $S_0$ and the new state $S_0$ and has a path metric of 6; the other candidate path metric corresponds to the transition between the old state $S_8$ and the new state $S_0$ and has a candidate path metric of 16. Since the path metric of 6 is less than candidate path metric 16, the new path metric is selected as 6, and the selected transition is between the old state $S_0$ and the new state $S_0$.

Looking again at FIG. 5, the old state $S_0$ has a prior optimal path of ". . . 1011," whereas the old state $S_8$ has a prior optimal path of ". . . 1100." The optimal path associated with the old state is shifted one bit to allow the new data "0", indicative of the transition between the old state $S_0$ and the new state $S_0$ to be added to produce a new optimal path ". . . 10110."

Figure 6B:
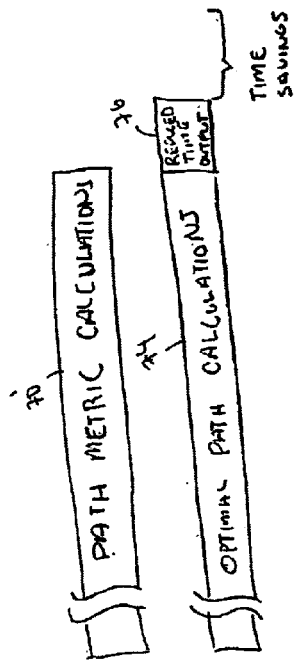

FIG. 5 makes it clear that updating the optimal path values is computationally intensive. Thus, the method of the present invention doesn't make much sense on a single processor system. However, if the optimal path update can be parallelized with the new path state update, the improvement of the serial traceback speed at the end will improve the total of the entire algorithm. This is illustrated in FIGS. 6A and 6B.

FIG. 6A illustrates the conventional algorithm in which the serial traceback 72 is done after the path metric calculations. In the system of the present invention, while the path metric calculations 70' are done, the optimal path calculations 74 are done in parallel. Even though these optimal path calculations 74 are extensive—in fact, much more extensive than the traceback calculations 72 shown in FIG. 6A—the total time is reduced.

Figure 6C:
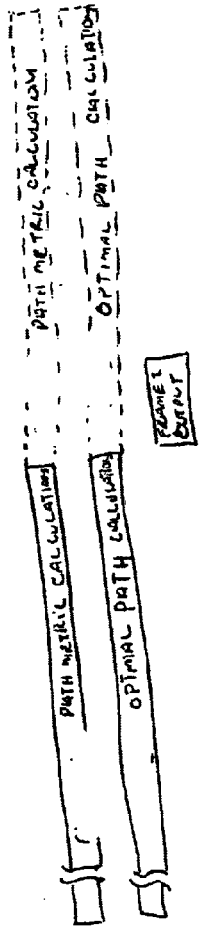

FIG. 6C shows an embodiment in which the readout steps are done in parallel with the processing steps for the next block of symbols. This further speeds up the operation of the Viterbi algorithm. The readout operation can operate on a previous optimal path value memory while the current optimal path value memory is accessed by the optimal path value update operation.

Figure 7:
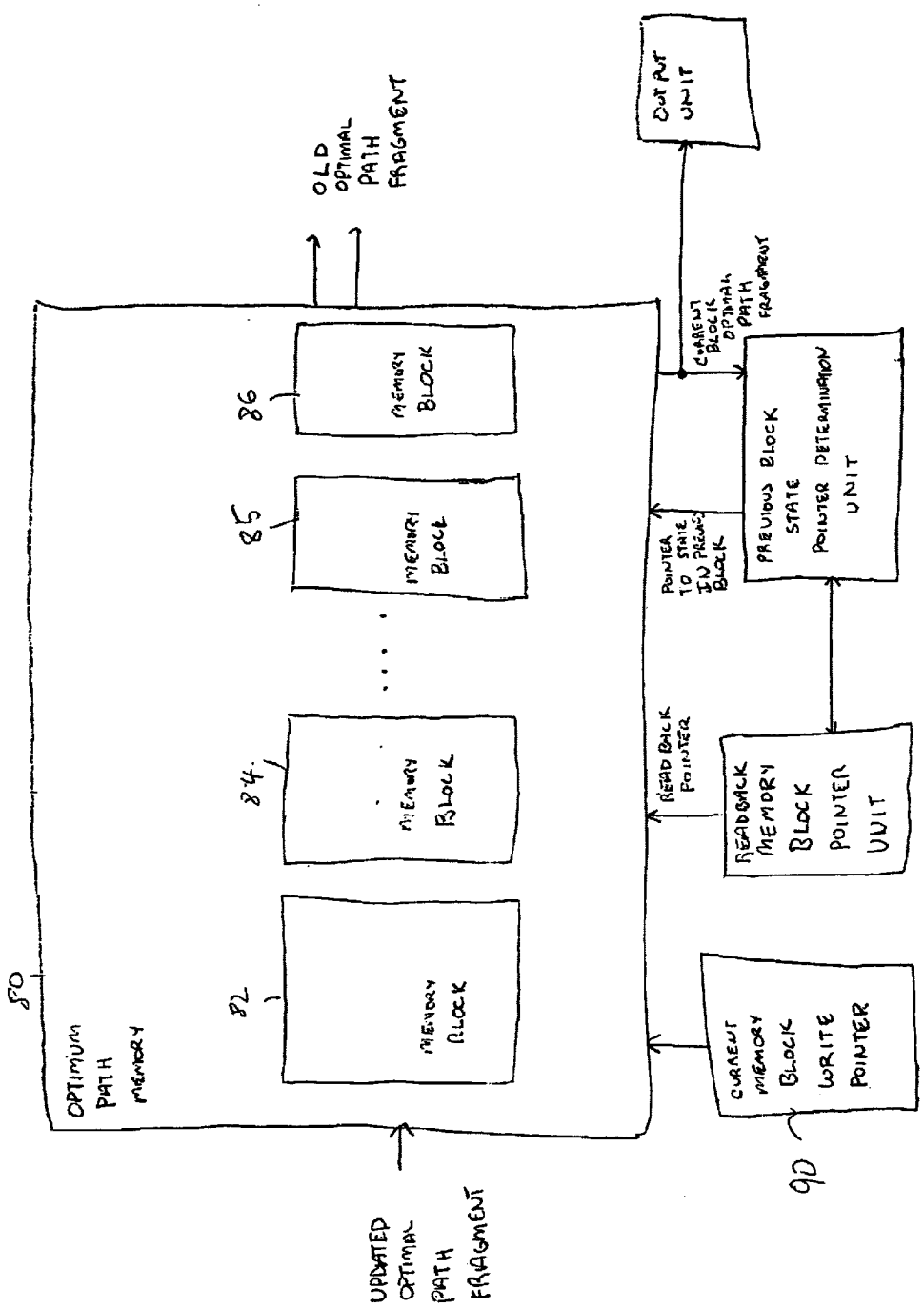
FIG. 7 is a diagram that illustrates one embodiment of an implementation of the optimum path memory in one embodiment of the present invention.

FIG. 7 illustrates one embodiment of the present invention wherein the optimal path memory is broken into a number of smaller memory blocks. The breaking of the memory into a number of smaller memory blocks allows the processing to be done on smaller sized optimal path value fragments, rather than the entire optimal path value. In this embodiment, the updated optimal path fragments are written into a memory block. For example, in one embodiment, the memory block 82 is written into first. When the memory block 82 is filled with data, the next memory block 84 is written into. This is done until memory block 86 is written into, such that all optimal path data for the entire block of transmitted symbols is stored. The current block pointer 90 tells which of the memory blocks to write the updated path value fragments into, and from which memory block to obtain the optimal path fragments of the prior states. Note that in a preferred embodiment, the optimal path value fragment stored in each of the filled memory blocks is not later modified. In this preferred embodiment, the system produces a pointer to the address in the previous memory block of the next fragment of the optimal path for a state. Once a memory block is filled, that fragment of the optimal path will remain at the same address corresponding to the state of the trellis when the block is filled.

In one embodiment, the address pointer can be directly determined from bits within the previous optimal path value fragment. Looking at FIG. 10, the information bits are read into the convolution encoder which is implemented as a shift register. The optimal path value for the selected lowest energy state will, in a preferred embodiment, be the transmitted symbols of data. Consider the situation where the transmitter and the convolution encoder have transmitted symbols corresponding to a given state. When a memory block is filled up, the address of the optimal path fragment stored in the memory block will be at the address corresponding to the state of the convolution encoder when the block is filled up. The next bits transmitted from the convolution encoder are then decoded and placed in the optimal path value fragment stored in the next memory block. These next bits will also give the address of the previous optimal path fragment in the previous memory block.

When a full symbol block is transmitted, the optimal path corresponding to the state with the lowest path metric is selected. In some embodiments, the block of data is stuffed with zeros to cause the final state of the transmitted block of symbols to be state zero. The optimal path value fragment from this state is read out from the memory block 86. The most significant bits of this optimal path fragment will indicate an address of the fragment in the memory block 85. This optimal path value fragment is then read out and the most significant bits point to the optimal path value fragment in the prior memory blocks, and so on. This is done until all of the optimal path value is read out of the memory blocks.

By breaking the optimal path value into optimal path fragments, the memory stores and optimal path value operations shown in the previous figures can be more efficiently done. In this embodiment, a number of optimal path value fragment reads equal to the number of memory blocks are done. In one embodiment in which there are 192 symbols in a block and each memory block is set up to be 32 bits wide, six memory blocks are used to implement the optimal path memory.

In an embodiment in which the most significant bits in the optimal path fragment do not effectively act as a pointer to the address in the prior memory block, bits can be stuffed into the memory blocks in order to act as such a pointer. The downside of this embodiment is that it may increase the number of memory blocks required.

Figure 8:
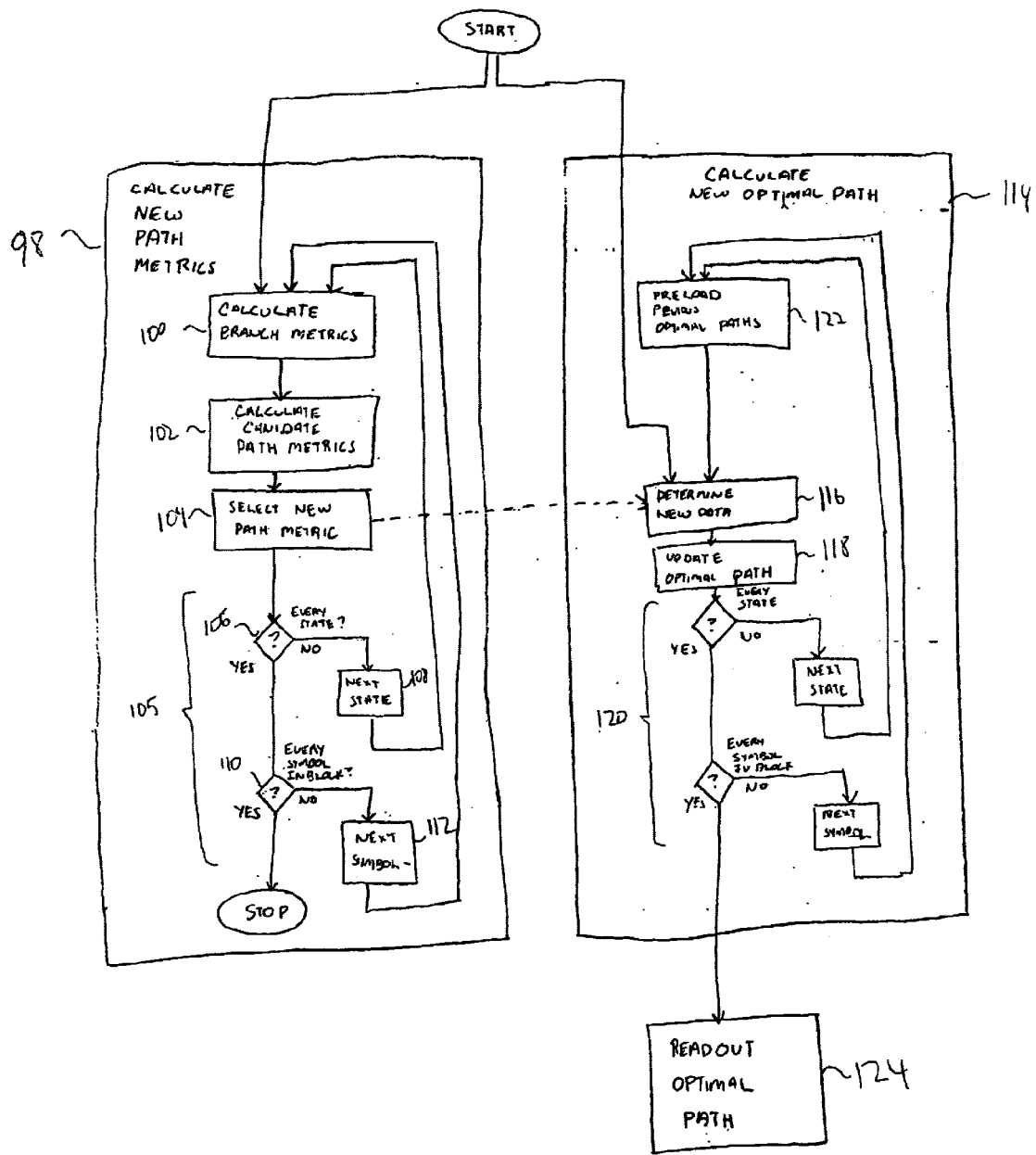
FIG. 8 is a flow chart that illustrates the parallel operation of the new path metric calculation and new optimal path calculations in one embodiment of the present invention.

FIG. 8 illustrates a flow chart illustrating the operation of the parallel Viterbi method of the present invention. In the path metric calculations 98, the branch metrics for a state transition are calculated in step 100. In a preferred embodiment in which the convolution encoder is zeroed out at the end of a block, the system knows that the previous state is state zero. In step 102, the candidate path metrics are calculated by adding the calculated branch metrics to previous path metric data. In step 104, a new path metric is selected. This new path metric can be then stored in the path metric storage. Step 106 determines whether every state for a symbol has had its path metric updated. If not, the system goes, in step 108, to the next state in the trellis. After every state for a symbol is checked, in step 110 it is checked whether every symbol in the block has been operated on. If not, the next symbol is moved on to in step 112.

The optimal path calculation 114 preferably operates in parallel with the calculation of the new path metric. In step 116 the construction of the path metric produces an indication of the traceback pointer. This traceback pointer allows for the determination of the new data in step 116 and the updating of the optimal path in step 118. The steps 120 effectively duplicate the steps 105. For this reason, indications from the calculation of the new path metrics can be used to update the next state and the next symbol in one embodiment, in order to speed up the operation of the steps 116 and 118, the previous optimal paths are preloaded in a step 122. The previous optimal path values can be updated in the updating step 118. Note that the calculation of the optimal path can be computationally intense, requiring calculations for every trellis state in each symbol period. Thus, if there are 256 trellis states and 192 symbols in the block, to number of updates of the optimal path in the calculation steps 114 is 256×192. Due to the parallelism, calculation steps 114 are done at the same time as new path metric block calculation steps 98. Thus, the readout of the optimal path in step 124 can be made much quicker than the traceback technique done in the prior art, reducing the total calculation time.

Figure 9:
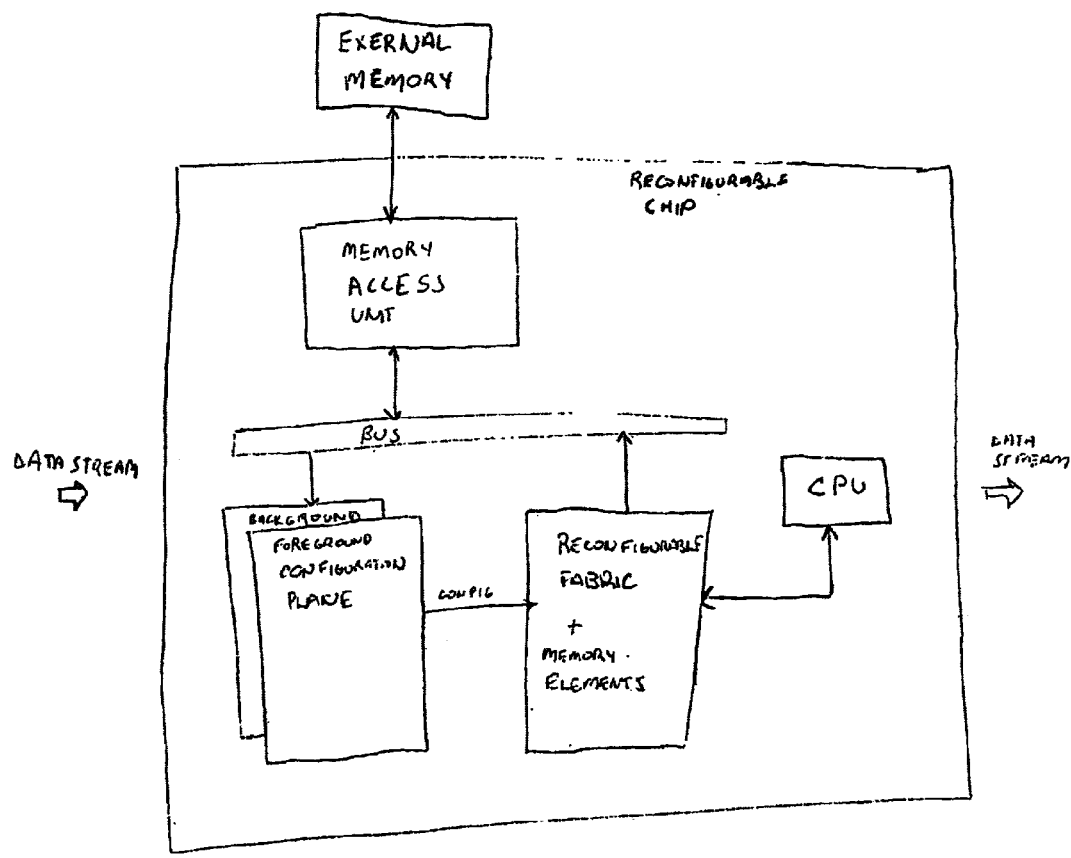
FIG. 9 is a diagram that illustrates a reconfigurable chip system which can be used to advantageously implement the parallel Viterbi algorithm of the present invention.

FIG. 9 illustrates a reconfigurable chip. In the reconfigurable chip, background and foregoing planes of configurations, such as the configurations used in the Viterbi algorithm, can be loaded to configure the reconfigurable fabric. In this system, the resources of the reconfigurable fabric are typically fixed. Thus there can often be a situation in which the configuration used to calculate the path metrics leaves enough fabric resources to allow the implementation of the optimal path updating logic. This means that the optimal path updating logic can be implemented without requiring the use of an additional reconfigurable chip. Thus the time savings in using the optimal path value construction can be produced without a resource penalty. Note that this might not always be the case.

Figure 10:
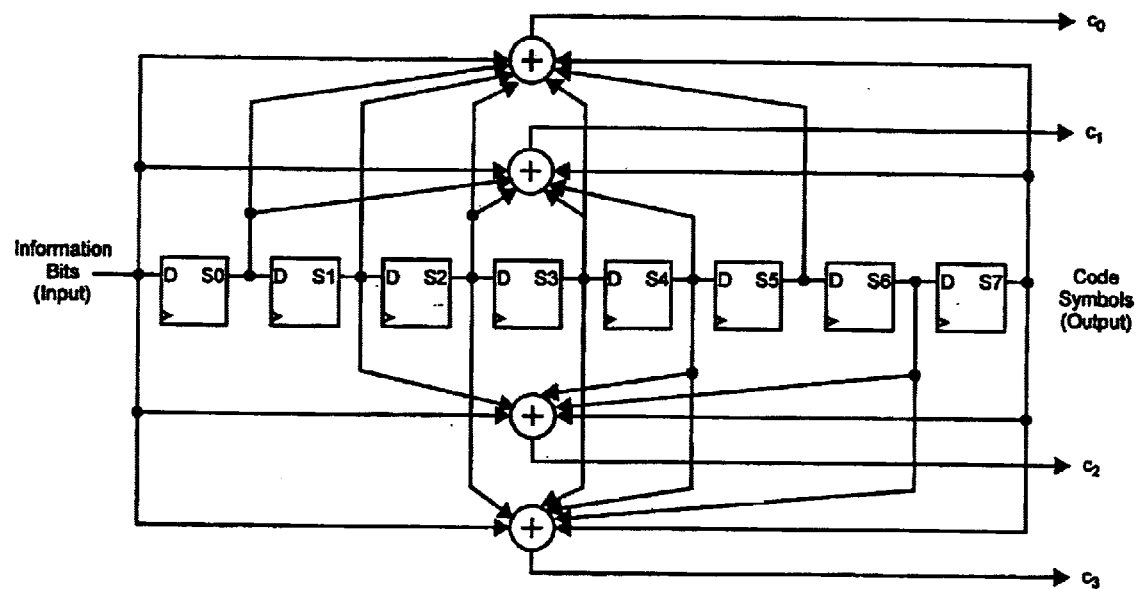
FIG. 10 is a diagram that illustrates an example of a ¼ convolution encoder.

FIG. 10 illustrates an example of a convolution encoder in a transmitter. The bits in the linear shift register correspond to the state of the Viterbi trellis. The system shown in FIG. 10 is a one-fourth convolution encoder in which four output bits are provided for each input bit. As each new information bit is put into the convolution encoder of FIG. 10, the linear shift register of the convolution encoder can go into only two new possible states. This corresponds to the two possible transitions in the Viterbi trellis. Each transition is associated with a new input information bit, which causes the state transition. These two different states of the convolution encoder cause the four output signals, C0, C1, C2 and C3, to be one of two different patterns corresponding to the two different possible states. At the detector, the four signals C0–C3 are transmitted and received. Estimates of the value for C0–C3 are then produced. Since the convolution encoder can be in only two states, the detector can calculate the ideal values for C0–C3 for both of the two states. The deviation of this ideal value of C0–C3 from the real values of C0–C3 are used to produce the error signal or branch metric for each of the transitions in the trellis, as is shown in more detail in FIG. 12.

In a preferred embodiment, each block of symbols ends in enough states to clear the convolution encoder into state "0." This means that the final state of a block is state "0," and the optimal path value for state "0" can be selected at the end of the block. Other Viterbi implementations require the use of the lowest total path metric to select the correct optimum path value.

Figure 11:
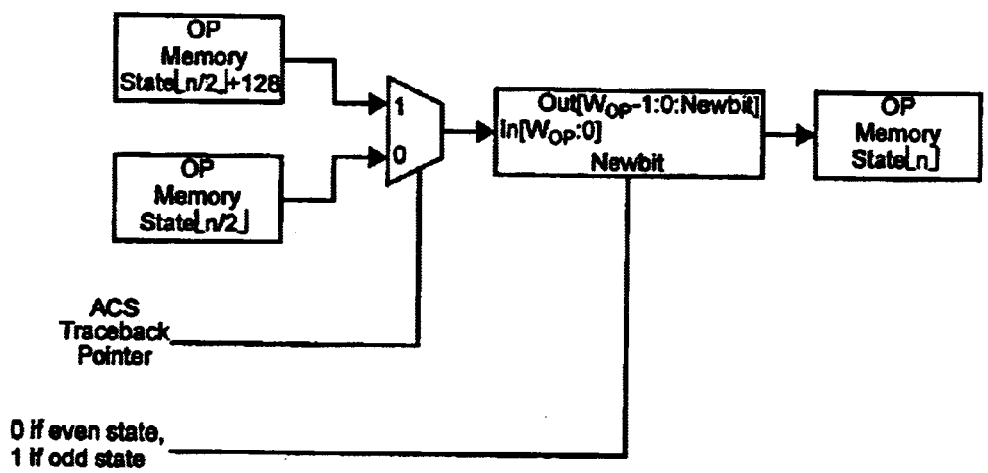
FIG. 11 is a diagram of an example of an optimal path update unit for one implementation of the present invention.

FIG. 11 illustrates the optimal path memory update algorithm block diagram of one embodiment of the present invention. Looking again at the convolution encode example of FIG. 10, note that if there are k states in the convolution encoder and the convolution encoder is in state m, the next possible states are (2m) mod $2^k$ or (2m+1) mod $2^2$. From the current state n it is possible to determine the previous states in a similar manner. The previous state p is equal to the values of bits in registers S1–S7 shifted into locations S0–S6 with a zero or a one in the S0 position. This corresponds to the previous memory state: p is equal to the floor function of $n/2$ or the floor function of $n/2+2^k$. The addressing for the previous optimal path selection and for the previous path metrics is determined in this fashion.

Looking again at FIG. 11, the optimal path value or optimal path value fragments are sent to a multiplexer. The traceback pointer produced by the add/compare/select unit is used to send the selected optimal path value or optimal path value fragment into a unit that adds the new bit into the least significant bit and shifts the other bits. This is now used as the new optimal path value for the memory state n.

Figure 12:
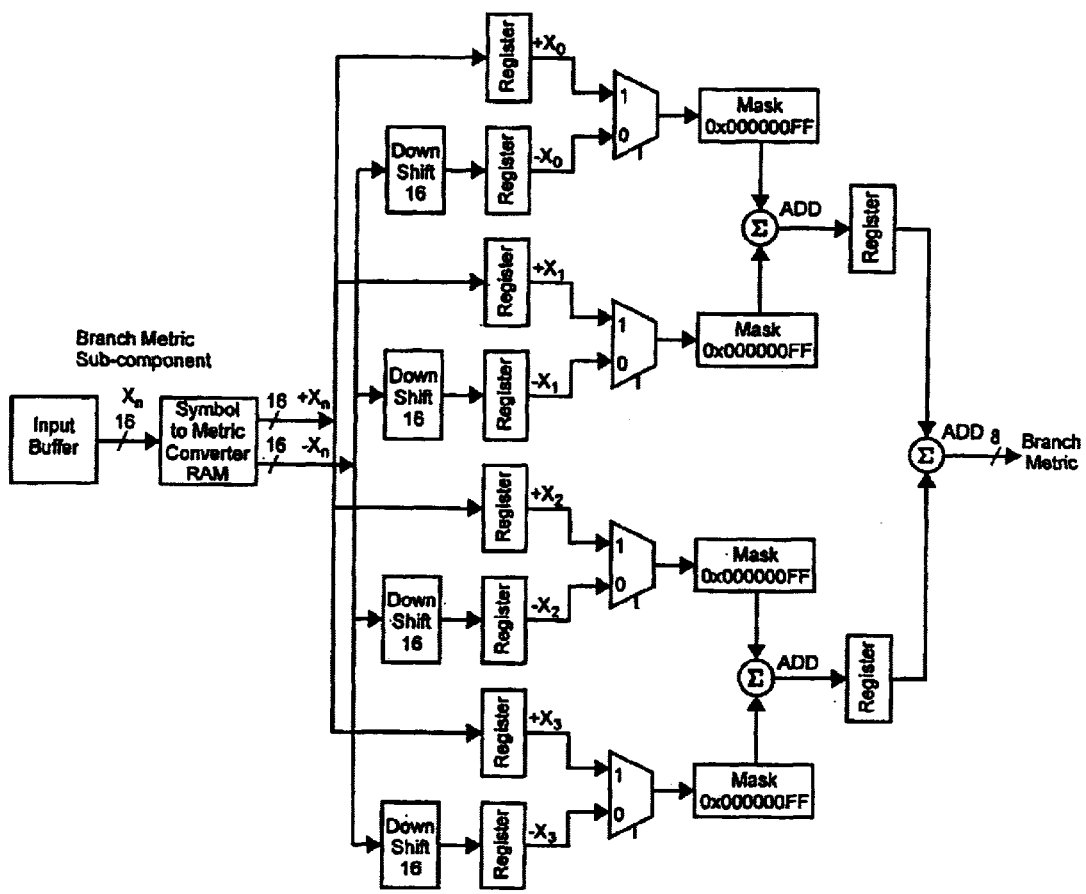
FIG. 12 is a diagram of a branch metric calculation circuit in one embodiment of the present invention.
Figure 13:
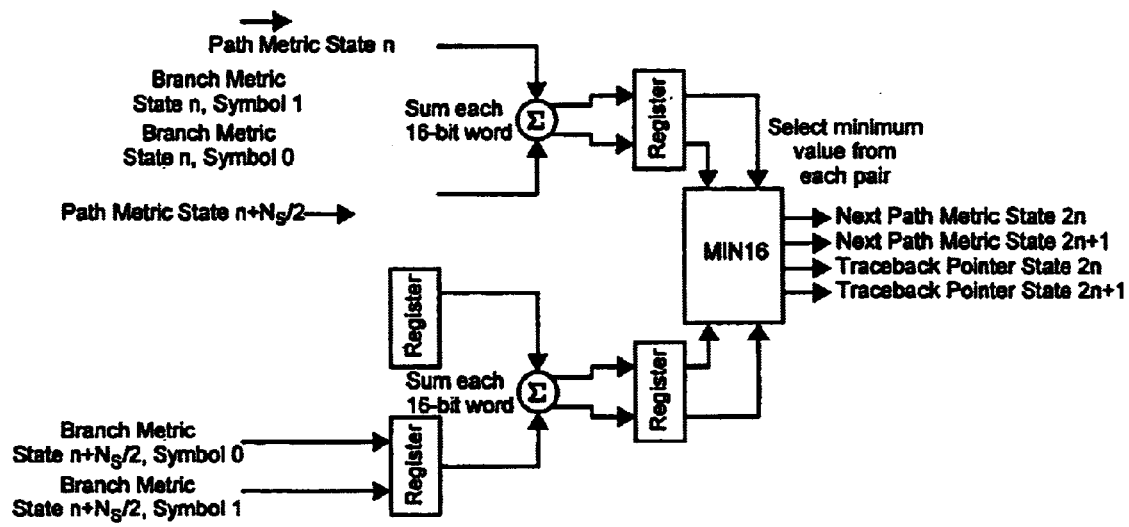
Figure 14:
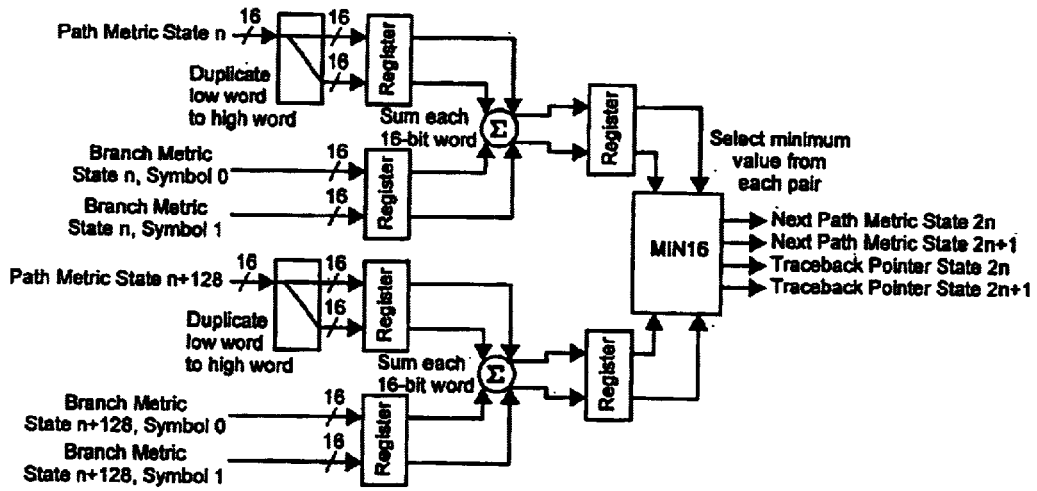
Figure 15:
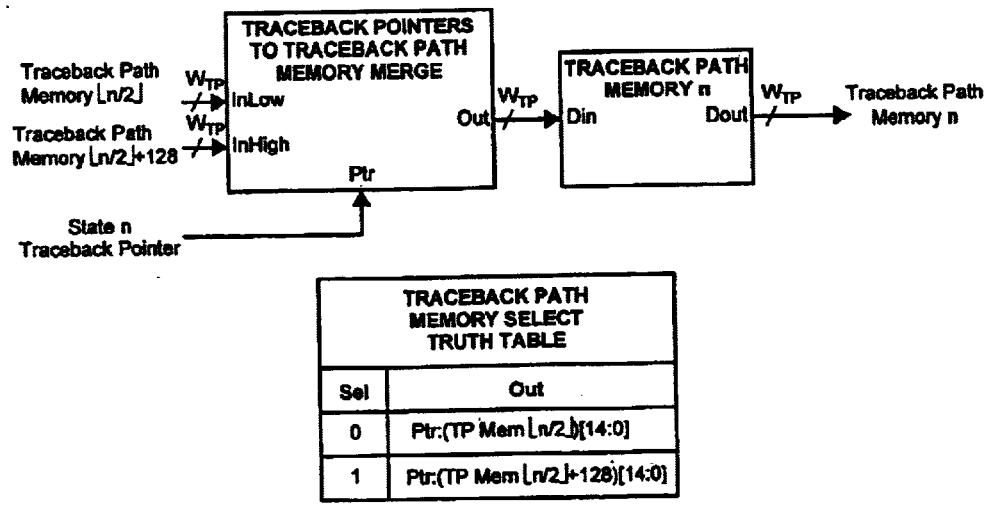
Figure 16A:
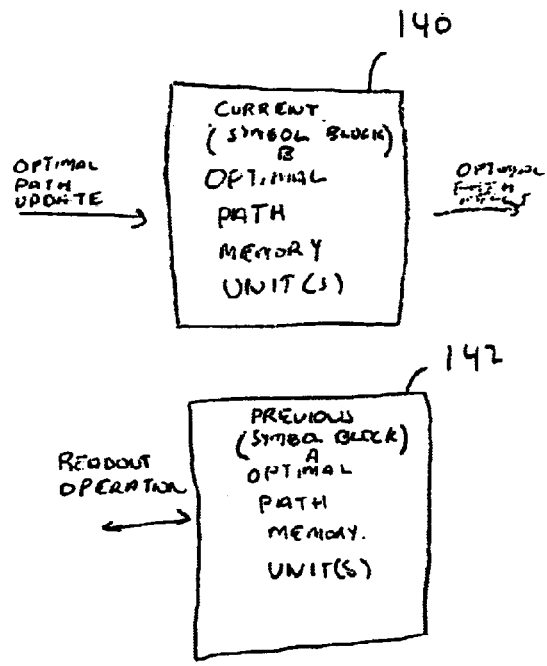
Figure 16B:
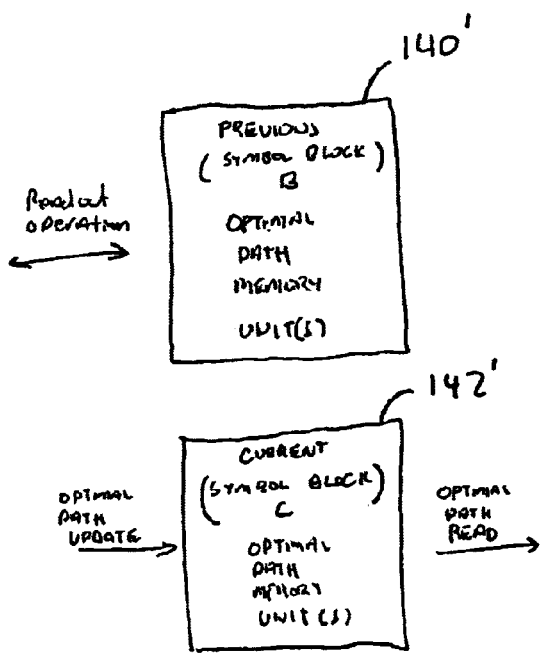

FIG. 12 illustrates the branch metric calculation circuit. Note that for binary phase shift keying (BPSK), a "1" is transmitted as a positive one and a "0" is transmitted as a negative one. In the detector, a 16-bit detected value for each transmitted code C0–C3 is created. In the ideal case these detected values would be either one or negative one but, due to noise and other effects, there can be a significant variation in the detected signal strengths. The deviation of four detected signals X0–X3 from the ideal values of the transmitted C0–C3 signals for a transition in the trellis is used to determine the branch metric. Details of one embodiment of the branch metric calculation are given in the Appendix.

Details of the implementation of the parallel Viterbi algorithm on a reconfigurable chip is given in the Appendix entitled Design and Implementation of a Parallel Viterbi Decoder.

It will be appreciated by those of ordinary skill in the art that the invention can be implemented in other specific forms without departing from the spirit or character thereof. The presently disclosed embodiments are therefore considered in all respects to be illustrative and not restrictive. The scope of the invention is illustrated by the appended claims rather than the foregoing description, and all changes that come within the meaning and range of equivalents thereof are intended to be embraced herein.

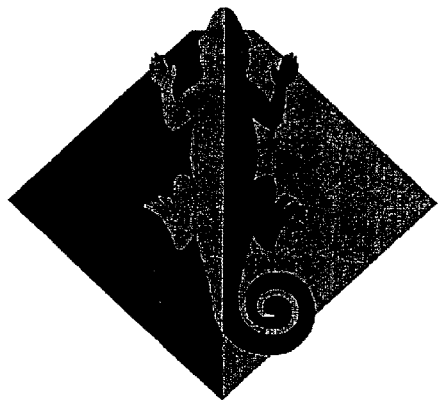
CHAMELEON
S Y S T E M S, I N C.
Design and Implementation of a Parallel Viterbi Decoder
by Dan Pugh
11/19/99

 CHAMELEON
S Y S T E M S, I N C.

© 1999 Chameleon Systems, Inc.
All rights reserved.

The following are trade names, trademarks, or registered trademarks of their respective companies:

Version History

| Date | Version | Description |
| --- | --- | --- |
| 11/17/99 | 0.1 | Initial version. Author(s): Dan Pugh |

For additional copies of this document, please contact:
Chameleon Systems, Inc.
1195 W. Fremont Avenue
Sunnyvale, CA 94087
Telephone: 408-730-3300
Facsimile: 408-730-3303

1.0 Overview

This paper outlines the design and implementation of a parallel Viterbi decoder that decodes the convolutional codes such as those used in IS-95 and IS-2000 CDMA systems. This design maintains the decoder functionality, but it deviates from the traditional Viterbi decoders in several areas:

- The structure of the generator polynomials in the convolutional code has been exploited in order to optimize the decoding process for parallel implementations.

- The individual branch metrics, although unique, are related. Some of the branch metrics must be calculated while others may be implied. By leveraging the structure of the generator polynomials in the convolutional encoder, the branch metric calculations are simplified.

- The path metric update calculations are performed in parallel to reduce path metric update times.

- A new memory structure has been added to the decoder that eliminates the need to perform a serial trace back through the decoder states in order to obtain the best estimate of the transmitted data. This new memory structure eliminates the need to store traceback pointers for each of the individual states. Rather than storing traceback pointers for each state, this design stores the maximum likelihood transmitted path into each of the states.

- In order to further reduce the overall computational time of the decoding process, the branch metric calculations and the path metric operations are pipelined so that they may operate in parallel. While the path metrics are being updated for one symbol, the decoder simultaneously computes the branch metrics for the next.

1.1 Terminology

The following symbols will be used is the description of the Viterbi decoder:

K Constraint Length, equal to one more than the number of state variables $N_S$ Number of states.

MLD Maximum Likelihood Decision

ACS Add, Compare, Select.

BM Branch Metrics

PM Path Metric

2.0 Theory of Operation

2.1 Convolutional Encoder

This paper outlines the implementation of a constraint length 9 (K = 9), rate 1/4 convolutional encoder. IS-2000 defines rate 1/2, rate 1/3, rate 1/4 convolutional encoders. As an example the K = 9, rate 1/4 convolutional encoder of the IS-2000 system will be used.

The generator functions for the rate 1/4 code are defined as $G_0(D) = 1 + D + D^2 + D^3 + D^4 + D^6 + D^8$  $G_0$ = 765 (octal)

$G_1(D) = 1 + D + D^3 + D^4 + D^5 + D^8$  $G_1$ = 671 (octal)

$G_2(D) = 1 + D^2 + D^5 + D^7 + D^8$  $G_2$ = 513 (octal)

$G_3(D) = 1 + D^3 + D^4 + D^5 + D^7 + D^8$  $G_3$ = 473 (octal)

The state of the convolutional encoder is initialized to state zero before the first output symbol is transmitted. Each information bit is encoded into four output code symbols, $c_0$, $c_1$, $c_2$ and $c_3$, are transmitted independently (BPSK for the example of IS-2000) starting with $c_0$. If $c_n=0$, maps to the -1 symbol, while $c_n=1$ maps to the +1 symbol. Figure 2-1 shows the structure of the K=9, rate 1/4 convolutional encoder.

Figure 2-1. K =9, Rate 1/4 Convolutional Encoder

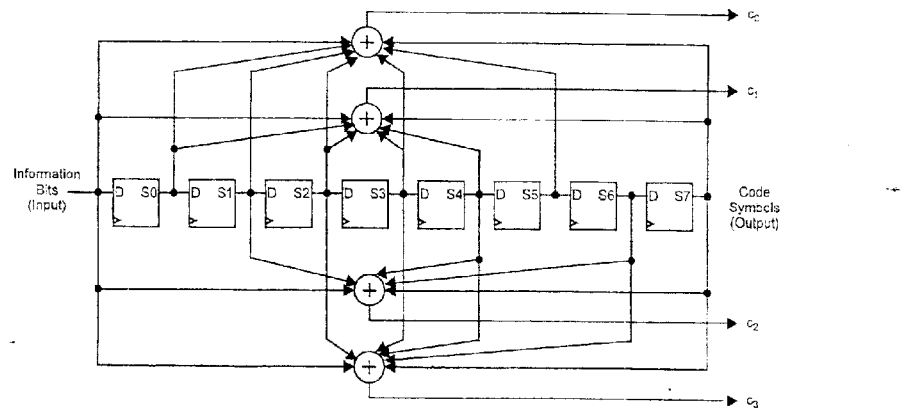

2.1.1 Block Convolutional Encoder

In many transmission systems, the transmitted symbols are divided into fixed block sizes. If the system has extra bandwidth, the decoder design may be simplified by appending extra zeroes (tail bits) to the end of the data bits in the transmitted block. If enough tail bits are transmitted, the convolutional encoder will be forced back to the zero state at the end of the block. This number of bits is defined by $N_{tailbits} = \log_2(K - 1)$, where K is the constraint length of the convolutional code. If the convolutional encoder is forced to the zero state at the end of the block, the decoder does not need to search for the minimum energy state at the end of a block, it is already known to be zero. The example of this paper shows the implementation of a block convolutional encoder/decoder, but the core of the design may be used in either a streaming or fixed block mode.

2.2 Channel Noise Model

The noise introduced by the transmission mediums, such as line-of-sight terrestrial channels can be accurately modeled by the additive white Gaussian noise (AWGN) model. The demodulated symbol, $Y_n$, may be represented by a random noise component added to the original transmitted signal, $X_n$.

Figure 2-2. AWGN Model

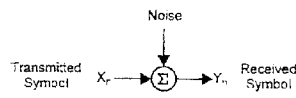

The probability density function of the Gaussian noise with nonzero mean and variance $\sigma^2$ for a single dimensional signal is given by:

$$p(y) = \frac{1}{\sigma\sqrt{2\pi}} e^{-\frac{(Y_n - Y_0)^2}{2\sigma^2}}$$

where $\sigma$ is the root-mean-square value of the noise voltage and $Y_0$ is the mean or dc value. We see that the probability density function is a function of $(Y_n - Y_0)^2$. This squared relationship is the basis for using the square of the Euclidian distance as the branch metric function. The other terms in the probability density function may be ignored for use in the branch metric calculation because they will be common to all of the metrics and only introduce a scaling or DC offset effect.

2.3 Viterbi Decoder

The Viterbi algorithm, originally published in 1967 is a maximum likelihood technique. Convolutional encoding with Viterbi decoding has become one of the most widely used forward-error-correction (FEC) techniques. The following sections give a general description of the Viterbi decoding algorithm. A detailed explanation of the Viterbi decoding algorithm is beyond the scope of this paper, but may be found in many communications texts. The Viterbi decoder may be decomposed into several primitive elements:

- Read Input Symbols
- Compute Branch Metrics
- Update Path Metrics
- Determine maximum-likelihood path through the trellis (traceback)

2.3.1 Read Input Symbols

The input to the Viterbi decoder consists of either single or multidimensional symbols. For the example of this paper, we assume a rate 1/4 convolutional encoder whose outputs are transmitted independently over a BPSK channel. The four outputs of the convolutional encoder compose a single four-dimensional orthogonal signal. Because the four outputs are transmitted independently, they are orthogonal to each other and the AWGN channel noise model may be applied independently to each of the four outputs of the composite symbol.

In some systems such as IS-95 or IS-2000, symbols are replicated and transmitted redundantly. The design example of this paper assumes that the symbol replication method is not employed. If a communications system uses this method, the composite components of the symbols should be combined before they are forwarded to the branch metric circuit. The core of the model shown here will work with or without symbol replication, only the input circuit will be effected.

2.3.2 Branch Metric Computation

The branch metric is used to determine the maximum-likelihood probability that the received symbol is the same as the transmitted symbol for a given state of the convolutional encoder. Since the state of the encoder is not known for every received symbol, branch metrics need to be calculated for each of the $2^{K-1}$ states For the symbol received, $Y_n$, at time n, the branch metric for state k is defined as the squared Euclidean distance between $Y_n$ and the expected signal, $X_{km}$. For BPSK, $X_{km}$ (m = encoded data bit = 0,1) is assumed to take the values of either -1 or +1, respectively. For a single dimensioned BPSK symbol, the squared distance calculation for the branch metric at time n for information bit m, is given by:

$$BM_n(k,m) = (Y_n - X_{km})^2 = Y_n^2 - 2Y_n X_{km} + X_{km}^2$$

$$BM_n(k,0) = (Y_n - X_0)^2 = Y_n^2 + 2Y_n + 1$$

$$BM_n(k,1) = (Y_n - X_1)^2 = Y_n^2 - 2Y_n + 1$$

One should note that the $Y_n^2$ term is common to both of the branch metrics for a given received symbol and the $X_m^2$ term is always equal to 1. Since the $Y_n^2 + X_{km}^2$ term can be considered a dc offset, and the -2 term is a constant scaling factor, the branch metric is then reduced to:

$$BM_n(k,m) = -Y_n X_{km}$$

$$BM_n(k,0) = +Y_n,$$

$$BM_n(k,1) = -Y_n$$

For the example of the rate 1/4 encoder defined in Figure 2-1, the four encoded symbol bits, $c_0 - c_3$, are mapped into four separate BPSK symbols that are transmitted independently. Because the BPSK symbols are independent, there noise components are also independent and the AWGN model for the channel is still valid. When four independent BPSK symbols are combined into a single four-dimensional symbol for the Viterbi decoder, the branch metric becomes:

$$BM_n(k,m) = \Sigma[(Y_{ni} - X_{mi})^2], \{i=0, 1, 2, 3\} = (Y_{n0} - X_{m0})^2 + (Y_{n1} - X_{m1})^2 + (Y_{n2} - X_{m2})^2 + (Y_{n3} - X_{m3})^2$$

which reduces to: $\quad BM_n(k,m) = -Y_{n0}X_{m0} + -Y_{n1}X_{m1} + -Y_{n2}X_{m2} + -Y_{n3}X_{m3}$ Since $X_{mi}$ can only take the values of -1 or +1, the branch metric is reduced to the sum or difference of each of the four received composite symbols $Y_{n0} - Y_{n3}$.

2.3.3 Path Metric Computation

To understand how the convolutional encoder changes state from one symbol interval to the next, we may look at the convolutional encoder in Figure 2-1, where the state of the encoder is defined by the bits in registers S0 through S7. Upon the rising edge of the symbol clock, a new information bit is shifted into state variable S0, and state variables S1 through S6 are shifted into state variables S2 through S7. This translates into two possible state transitions from each state k, depending on the value of the information bit i:

If i=0, nextstate = 2k

If i=1, nextstate = 2k + 1

To show the 256-state convolutional encoder state transition graph of the encoder outlined in this design example is impractical. For illustrative purposes, Figure 2-3 shows the state transition graph of a similarly structured sixteen-state convolutional encoder.

Figure 2-3. 16-State Convolutional Encoder State Transition Graph

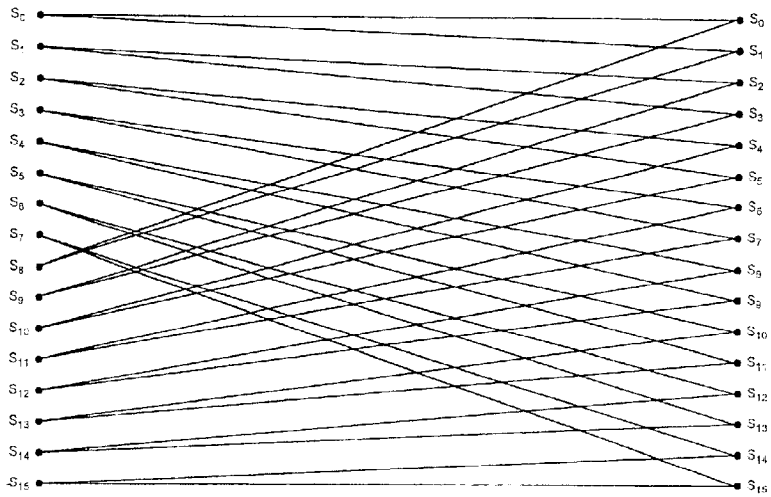

For each received symbol, the path metric is calculated for each of the $2^{K-1}$ states to determine the maximum-likelihood probability that the convolutional encoder is in a specific state. This is done by calculating the minimum energy path into each state and updating the metric. For each state there are two possible paths into that state.

To define the input paths into a given state, the floor function, $\lfloor x \rfloor$, must first be defined. The floor of a positive rational number is the closest whole integer less than or equal to the number. For example $\lfloor 2.7 \rfloor = 2$ and $\lfloor 3 \rfloor = 3$. For each state k there are two possible input paths:

state k previous state path 1:     state $\lfloor k/2 \rfloor$ state k previous state path 2:     state $(\lfloor k/2 \rfloor + 2^{K-2}) \bmod 2^{K-1}$ The circuit updates the path metrics by calculating the path metrics for both of the possible paths into a given state and selecting the one with the lower value. Lower path metric values are associated with

a received symbol being closer to the predicted transmitted symbol. The path metric PM(k), for state k is defined as:

New path metric = PM(k) = MINIMUM(A, B), with

A = path metric path 1 into state k: $(PM(\lfloor k/2 \rfloor) + BM_n(\lfloor k/2 \rfloor, m))$ B = path metric path 2 into state k: $(PM((\lfloor k/2 \rfloor + 2^{K-2}) \bmod 2^{K-1}) + BM_n((\lfloor k/2 \rfloor + 2^{K-2}) \bmod 2^{K-1}, m))$ where m=0 for k=even and m=1 for k=odd The path metric update circuit does an add, compare, select (ACS) function of the two previous path metrics.

2.3.4 Determine maximum-likelihood path through the trellis (traceback)

This decoder design uses a new technique to pickup the maximum-likelihood path through the convolutional encoder's trellis. Before the new algorithm is discussed, the traditional method is reviewed for comparison.

2.3.4.1 Traditional Viterbi Traceback Algorithm

The traditional Viterbi decoding algorithm keeps a history of state pointers as it processes path metrics and determines the maximum likelihood state transition into each state. After the $L_{BLOCKLENGTH}^{th}$ symbol is received and the path metrics are updated for each of the states, the Viterbi algorithm finds the state with the minimum path metric. The traceback pointer associated with this minimum path metric is examined to determine which state was the maximum likelihood state at the previous symbol interval. If the traceback pointer is 0, then the maximum likelihood state into state n is state $\lfloor n/2 \rfloor$. If the traceback pointer is 1, then the maximum likelihood state into state n is state $(\lfloor n/2 \rfloor + 128)$. The Viterbi algorithm then examines the traceback pointer for state $\lfloor n/2 \rfloor$ or $(\lfloor n/2 \rfloor + 128)$, at time k-1, to determine if the value of the traceback pointer for state n at time k is 0 or 1 respectively. This traceback procedure is repeated to traverse back through the trellis at least $L_{TRACEBACK}$ (at least three or four constraint lengths) units in time in order to ensure convergence of the traceback path with the optimal path. At this point a single data bit is decoded and sent to the output circuit. The algorithm may be altered where several symbols are picked up, but the serial process of the reverse traversal through the trellis is still required.

To aide block Viterbi decoding, $L_{TAIL}$ zeroes (tail bits) may be transmitted at the end of the block of $L_{DATA}$ data bits to guarantee that the convolutional encoder returns to state zero at the end of the block of length $L_{DATA} + L_{TAIL}$. While transmitting the tail bits eliminates having to search for the minimum energy state at the end of the block, the trellis still must be traversed backwards in order to determine the maximum likelihood transmitted bit sequence. Since tracing back from one state to the previous depends on the present state, this process must be repeated $L_{DATA} + L_{TAIL}$ times until all of the transmitted bits are

CHAMELEON
SYSTEMS, INC.

determined. Even for the simpler case of block decoding, the Viterbi algorithm's traceback operation is a serial process and does not lend itself to a faster, parallel implementation.

2.3.4.2  Improved Maximum-Likelihood Path Detection Method

The traditional Viterbi traceback algorithm discussed above is a serial process and cannot be implemented in a highly parallel fashion. Even when the branch metric and path metric circuits are improved with parallel implementations, the traceback process remains a serial process. The traditional Viterbi decoding method updates the path metrics to find the maximum-likelihood state of the decoder and then traces back a single path through the trellis. This path corresponds to a specific transmitted bit pattern. The procedure for decoding points in the algorithm presented here is quite different. For simplicity, only the procedure for block decoding will be described. Similar operations can be performed to implement a continuous stream decoder.

Rather than storing a single traceback pointer for each of the last $L_{DATA} + L_{TAIL}$ units in time for each of the states, the data bits for the maximum likelihood transmitted sequence for the last $W_{TP}$ (Traceback Path Memory width) data bits are stored. The serial traceback procedure may be eliminated if a new data structure is added to the output of the add, compare, select (ACS) block. If instead of storing a single pointer in the traceback memory for each of the states, the entire optimal path leading up to that path is stored in the Optimal Path (OP) memory. As each symbol is received by the decoder, the OP circuit updates the optimal paths for each of the $2^{K-1}$ states. The OP circuit reads the optimal path of the state indicated by the traceback pointer generated by the ACS block. The bit corresponding to a transition from the best previous state to the given state is appended to the OP memory contents of the selected optimal path and then stored back in the OP memory.

In a parallel implementation the OP circuit prefetches the previous optimal paths of the two states that precedes the state to be updated. The OP circuit uses the traceback pointer of the ACS circuit to select which of the two optimal paths is selected. Note that the two previous state OP memory addresses are the same as the previous state path metric memory addresses. The OP circuit may be implemented in parallel with the ACS block in order to share address generators for the OP and PM memories.

As each symbol is received, a new bit is appended to the OP memory. The OP memory contents grow with the addition of each new bit in the optimal path for each state. Since it is usually impractical to perform a read/modify/write operation on the entire history of an optimal path, the OP memory must be divided into workable blocks.

2.3.4.2.1  Optimal Path (OP) Memory Update Algorithm

The ceiling operator, $\lceil x \rceil$, is defined as the closest integer greater than or equal to the argument x. For example $\lceil 2.2 \rceil = 3$ and $\lceil 5 \rceil = 5$.

Chameleon Confidential

The OP memory must be divided into practical word widths. Let $W_{OP}$ be defined as the bit width of the OP memory. If a block decoder of $L_{BLOCKLENGTH}$ bits is implemented, there will need to be $L_{OPBLOCKS} = \lceil L_{BLOCKLENGTH} / W_{OP} \rceil$ blocks, of memory of length $2^{K-1}$. The following C code updates the OP memory contents.

```
void Update_OP_Memory (int TracebackPointer)
#define NUMSTATES 256
#define MEMORYWIDTH 32
int NumBitsShifted = 0;
int OP_Memory_Block_Index = 0;
for (ReceivedSymbol=0;ReceivedSymbol<BlockSize;ReceivedSymbol++)
begin
   NumBitsShifted = NumBitsShifted + 1;
   if (NumBitsShifted == MEMORYWIDTH)
      begin
         OP_Memory_Block_Index = OP_Memory_Block_Index + 1;
         NumBitsShifted = 0;
      end
   int state;
   int BestPath;
   begin
      for (state=0;state<NumStates;state--)
         begin
            if TracebackPointer
               BestPath = OP_Memory[state/2];
            else
               BestPath = OP_Memory[(state/2)+ (NUMSTATES / 2)];
            if ((state % 2) == 0)/* is the state even */
               OP_Memory[state] = BestPath << 1;
            else /* the state is odd */
               OP_Memory[state] = BestPath << 1 | 1; /*append 1 to the shifted word */
         end;
   end;
end;
```

11/19/99

Figure 2-4. Optimal Path (OP) Memory Update Algorithm Block Diagram

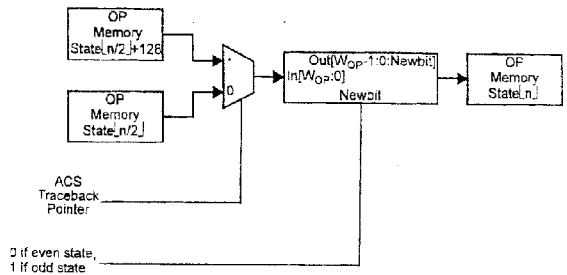

ACS Traceback Pointer 0 if even state,
1 if odd state

2.3.4.2.2 Optimal Path Assembly Algorithm

In order to simplify the explanation of the Optimal Path Assembly Algorithm, a block convolutional encoder is assumed. The algorithm will also work with a standard, streaming mode convolutional encoder with a few minor modifications to the block code version.

The Optimal Path Memory Update algorithm stores the transmitted bits of the optimal path leading into each state. If the path is longer than the width, $W_{OP}$ of the OP memory, $L_{OPBLOCKS}$ words will be required to store the optimal path of each state. After all of the symbols in a block have been received and the path metrics and OP memories have been updated, the maximum-likelihood decoded bits may be read from the OP memories.

In order to better understand state transitions, one should look at the structure of the convolutional encoder shown in Figure 2-1. Figure 2-1 shows that the information bits get shifted into the state register bits from the least significant bit up to the most significant bit. As long as at least K-1 bits have been processed through the encoder, the state register contains the last K-1 information bits.

The decoded bits are read out of the OP memory starting with the most recently used OP block, which is denoted $OPBLOCK_{LAST}$. The first OP word is read from the OP memory location, $OPBLOCK_{LAST}(min\_pathmetric)$, corresponding to the state with the minimum path metric. If the convolutional encoder utilizes tail bits, as is the case with IS-95 and IS-2000 systems, the minimum energy final state is guaranteed to be state zero.

If $L_{BLOCKLENGTH}$ is not an integer multiple of $W_{OP}$ not all of the bits of the word in OP block $OPBLOCK_{LAST}$ are valid. If the last location is not completely filled, only the $L_{BLOCKLENGTH}$ % $W_{OP}$ least significant bits will be valid, where % is the modulus operator. The modulus function returns the remainder when one integer is divided by another. To pickup the next $W_{OP}$ maximum-likelihood decoded bits, we need

to know which state was the previous state to state $OPBLOCK_{LAST}(min\_pathmetric)$. In order to better understand state transitions, one should look at the structure of the convolutional encoder shown in Figure 2-1. Figure 2-1 shows that the information bits get shifted into the state register bits from the least significant bit up to the most significant bit. As long as at least K-1 bits have been processed through the encoder, the state register contains the last K-1 information bits. For a $2^{K-1}$ state convolutional encoder, the K-1 state bits correspond to the last K-1 transmitted information bits. We know that $OPBLOCK_{LAST}(min\_pathmetric)$ is the final state of the memory, and that the bottom K-1 bits of $OPBLOCK_{LAST}(min\_pathmetric)$ are also the same as the K-1 bit number of the index of $OPBLOCK_{LAST}(min\_pathmetric)$. Therefore the previous state into $OPBLOCK_{LAST}(min\_pathmetric)$ will be $OPBLOCK_{LAST-1}((OPBLOCK_{LAST}(min\_pathmetric))[K:1] >> 1)$. We repeat this process again to get the next $W_{OP}$ previous bits in the maximum-likelihood path. The maximum-likelihood previous state into $OPBLOCK_{LAST-1}(OPBLOCK_{LAST}(bestpath))$ will be $OPBLOCK_{LAST-2}((OPBLOCK_{LAST-1}(min\_pathmetric))[K:1] >> 1)$. This process is repeated until all of the OP memory blocks have been read.

The following C subroutine describes the optimal path assembly algorithm

```
procedure Read_Optimal_Path ()
    #define OPMAXBLOCK 256
    #define NUMSTATES 256
    #define OPINDEXMASK 0xFF
    int OP_Mem[OPMAXBLOCK][NUMSTATES];
    int Block_Index;
    int OP_Block;
    int OutWord[OPMAXBLOCK];
    begin
        Block_Index = Find_Min_State(last_state)
        /* MinLastState = 0 for block encoders with tail bits */
        for (OP_Block=OPMAXBLOCK; OP_Block=0; OP_Block--)
          begin
            OutWord[OP_Block] = OP_Mem[OP_Block,Block_Index]
            Block_Index = OP_Mem[OP_Block,Block_Index] << 1 ^ | OPINDEXMASK;
          end
    end;
```

3.0 Viterbi Decoder Implementation

The following sections detail the design of a Viterbi decoder with the modified traceback algorithm in the Chameleon Systems CS2112 programmable system-on-a-chip (PSOC) processor. These sections serve to both detail the design of the decoder as well as educate the user as to how to map large designs onto the CS2000 series of PSOC processors. The reader should refer to the Chameleon Systems CS2000 databook for a detailed description of the CS2112 PSOC.

3.1 Decoder Design Assumptions

- The design is being mapped to a Chameleon Systems CS2112 PSOC.
- A primary design goal is to maximize the performance of the decoder
- A highly pipelined architecture is required to achieve maximum performance
- The blocksize is defined such that no off-chip memory is required
- The design is for the K=9, rate 1/4 convolutional encoder of Figure 2-1
- The four symbol components of each encoder symbol is orthogonal
- The transmission channel can be modeled with an AWGN noise model
- The generator polynomials are defined in Section 2.1
- The blocksize, $L_{BLOCKLENGTH}$, is 256 symbols
- The encoder sends 8 tail bits at the end of the block
-

3.2 Decoder Design Partitioning

Since the primary design goal is to maximize performance, the decoder will be designed such that it may draw from all of the CS2112 resources. The design will thus be mapped into all four slices of the part.

3.2.1 Decoder Datapath Partitioning

The decoder design is a memory intensive design. Storage is required for the branch metrics, path metrics, and the optimal path memory.

3.2.2 Decoder Control Partitioning

- hierarchical control partitioning distributed control redundant control required if in different slices to minimize global interconnect

3.2.3 Decoder Routing Issues

3.3 Decoder Circuits

3.3.1 Decoder Input Circuit number of bits and why

3.3.2 Branch Metric Calculation number of bits, how are they stored

3.3.3 Branch Metric Storage describe why the metrics were stored as they were, to minimize read address generators

3.3.4 Path Metric Memory

3.3.5 Add-Compare-Select (ACS) Circuit

3.3.6 Optimal Path Memory

3.3.7 Optimal Path Memory Update Circuit

3.3.8 Decoder Control Circuits

3.3.8.1 Memory Address Generation Circuit

3.3.8.2 Master Control Circuit

3.3.8.3 Slave Control Circuits

3.4 Decoder Device Utilization

3.5 Decoder Performance

3.6 Expanding the Decoder to Support IS-2000

3.6.1 Branch Metric Circuit optimizations

For each received symbol at time n, the branch metrics $BM_n(k,0)$ and $BM_n(k,1)$ are needed to compute the path metric for each of the $2^{K-1} = 256$ states. Since $X_{mi}$ can only be either -1 or +1, we can note that there are only sixteen unique values of $BM_n(k,m)$. Rather than compute 512 redundant branch metrics, we store the sixteen unique branch metrics in LSM memories for later use.

To determine which branch metric equations are required at each Add, Compare, Select (ACS) butterfly circuit in the path metric circuits In order to minimize on-chip resources in the Viterbi decoder's branch metric calculation circuit, we can exploit the generator polynomial equations. It can be seen Branch Metric Circuit Implementation Figure 3-1. Branch Metric Calculation Circuit

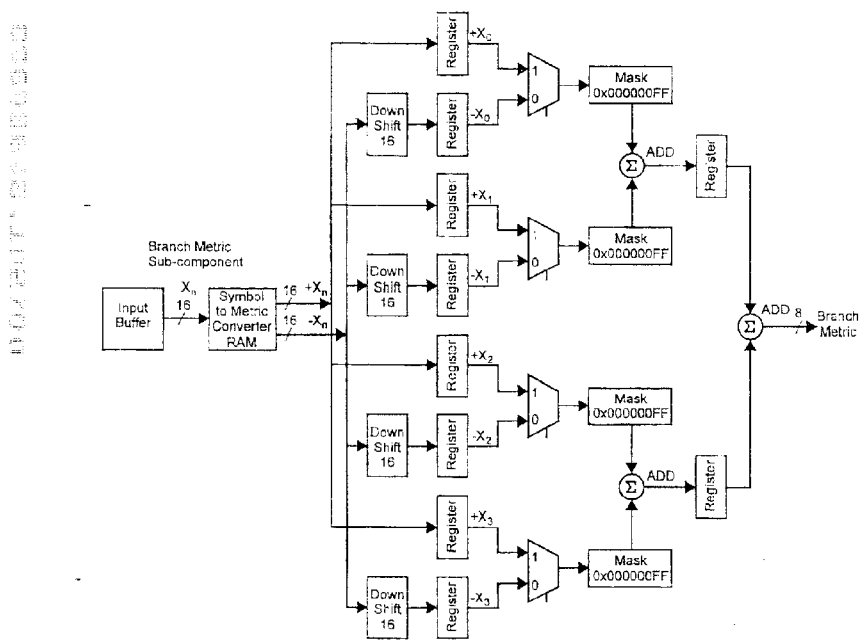

3.6.2 Path Metric Calculation
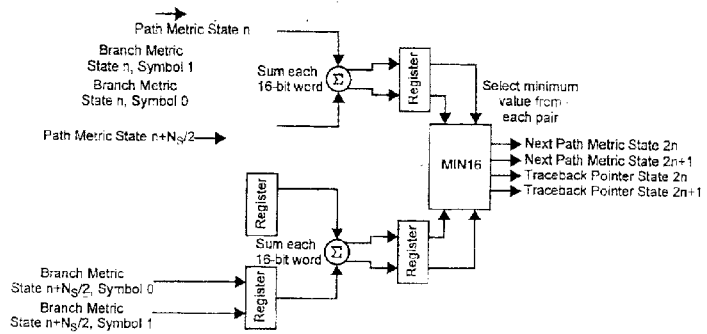
Figure 3-2. General ACS Circuit

Figure 3-3. CS2000 Path Metric Update Circuit

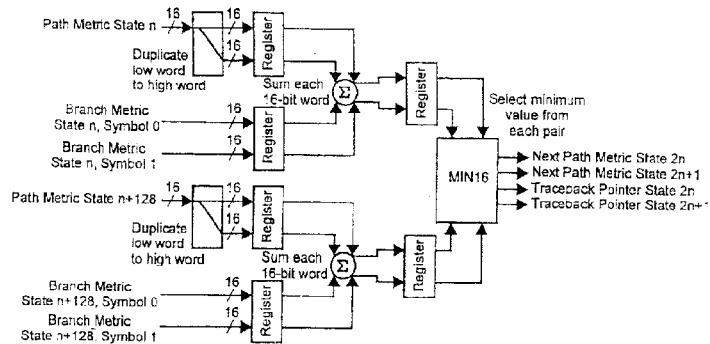

3.6.3 Traceback Path Memory Update

The Traceback Path Memory (TPM) circuit assumes that the decoder has at least two Path Metric circuits operating in parallel. Recall that the best traceback path comes from one of only two for a rate 1/2, 1/3, or 1/4 convolutional encoder. The TPM Update circuit fetches the last WTP bits from the two possible states feeding Figure 3-4. Single Traceback Path Memory Update Module

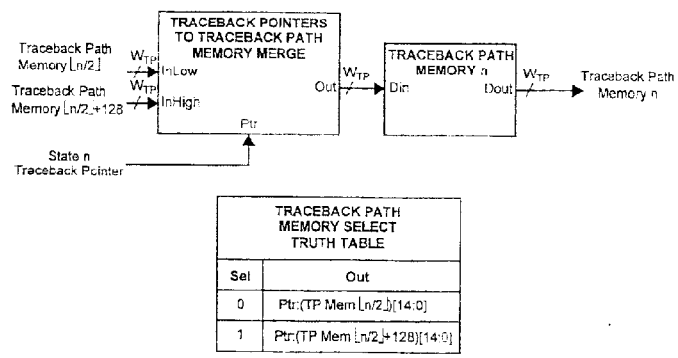

| TRACEBACK PATH MEMORY SELECT TRUTH TABLE | |
|---|---|
| Sel | Out |
| 0 | Ptr:(TP Mem ⌊n/2⌋)[14:0] |
| 1 | Ptr:(TP Mem ⌊n/2⌋+128)[14:0] |

Extra diagrams (to be deleted)
Figure 3-5. Dual Traceback Path Memory Update Module
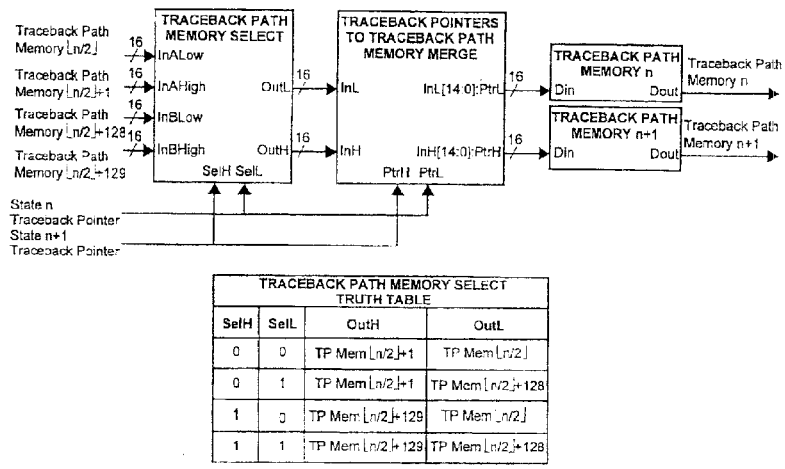
| TRACEBACK PATH MEMORY SELECT TRUTH TABLE | | | |
|---|---|---|---|
| SelH | SelL | OutH | OutL |
| 0 | 0 | TP Mem⌊n/2⌋+1 | TP Mem⌊n/2⌋ |
| 0 | 1 | TP Mem⌊n/2⌋+1 | TP Mem⌊n/2⌋+128 |
| 1 | 0 | TP Mem⌊n/2⌋+129 | TP Mem⌊n/2⌋ |
| 1 | 1 | TP Mem⌊n/2⌋+129 | TP Mem⌊n/2⌋+128 |

What is claimed is:

1. A method of implementing a Viterbi algorithm comprising:
   calculating branch metrics for branches of a Viterbi trellis;
   combining the branch metrics with old path metrics to produce candidate path metrics;
   selecting a new path metric associated with a selected trellis path for each state in the Viterbi trellis from the candidate path metrics; and
   composing an optimal path value for each state in the Viterbi trellis, the optimal path value indicating multiple transitions of the selected trellis path.

2. The method of claim 1 wherein the optimal path value comprises optimal path value fragments.

3. The method of claim 2 wherein the optimal path value fragments are stored in memory blocks.

4. The method of claim 1 further comprising using the optimal path value to determine an output value.

5. The method of claim 1 wherein the optimal path value for a lowest state of the Viterbi trellis at an end of a memory block indicates transmitted symbols.

6. The method of claim 1 further including using traceback pointer to select between two prior optimal path values.

7. The method of claim 6 further including selecting an optimal path value from the optimal path value for a state that transitions into a current state.

8. The method of claim 1 wherein the Viterbi algorithm is implemented by a reconfigurable chip.

9. The method of claim 1 wherein selecting the new path metric and composing the optimal path value operate in parallel.

10. An apparatus to implement a Viterbi algorithm comprising:
    a path metric storage to store a path metric associated with a selected trellis path for each state in a Viterbi trellis;
    a path update unit to update each path metric;
    an optimal path value storage to store an optimal path value for each state in the Viterbi trellis, the optimal path value indicating multiple transitions of the selected trellis path; and
    a an optimal path value update unit to update each optimal path value.

11. The apparatus of claim 10 further comprising an output unit to determine an output value for the Viterbi algorithm.

12. The apparatus of claim 11 wherein the output value is the optimal path value for the state with a lowest path metric.

13. The apparatus of claim 10 wherein the path update unit and the optimal path value update unit operate in parallel.

14. The apparatus of claim 10 wherein the Viterbi algorithm is computed using reconfigurable logic.

15. The apparatus of claim 14 wherein the optimal path value update unit uses resources not used by the path update unit.

16. The apparatus of claim 10 wherein the optimal path value storage includes multiple memory blocks.

17. The apparatus of claim 16 wherein the optimal path value comprises optimal path fragments stored in the multiple memory blocks.

18. The apparatus of claim 17 wherein the optimal path value update unit operates on the optimal path value fragments to update the optimal path value.

19. The apparatus of claim 17 wherein, during the readback operation, the optimal fragment from one memory block is used to determine a pointer to an optimal path fragment in another memory block.

* * * * *